United States Patent
Kuo et al.

(10) Patent No.: US 10,090,869 B1
(45) Date of Patent: Oct. 2, 2018

(54) SIGNAL RECEIVING APPARATUS IN COMMUNICATION SYSTEM AND SIGNAL PROCESSING METHOD THEREOF

(71) Applicant: MStar Semiconductor, Inc., Hsinchu Hsien (TW)

(72) Inventors: Chih-Cheng Kuo, Hsinchu Hsien (TW); Tai-Lai Tung, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/874,970

(22) Filed: Jan. 19, 2018

(30) Foreign Application Priority Data

Dec. 7, 2017 (TW) .............................. 106143020 A

(51) Int. Cl.
| | |
|---|---|
| H04B 1/10 | (2006.01) |
| H04L 5/00 | (2006.01) |
| H03G 3/30 | (2006.01) |
| H04B 1/16 | (2006.01) |
| H04B 15/00 | (2006.01) |

(52) U.S. Cl.
CPC ......... H04B 1/1027 (2013.01); H03G 3/3052 (2013.01); H04B 1/16 (2013.01); H04L 5/0062 (2013.01); H04B 15/005 (2013.01); H04B 2001/1045 (2013.01)

(58) Field of Classification Search
CPC ........ H04W 36/20; H04W 52/52; H04N 5/52; H04N 21/4382; H04N 21/438; H04B 1/1036; H04B 1/1027; H04B 2001/1045; H04B 15/00; H04B 10/60; H04B 17/354; H04B 1/109; H04L 25/03006; H04L 27/38; H04H 2201/20; H04H 20/57
See application file for complete search history.

(56) References Cited

U.S. PATENT DOCUMENTS

| | | | |
|---|---|---|---|
| 8,218,092 B1 * | 7/2012 | Cohen .................... | H04N 5/455 348/726 |
| 8,537,284 B2 * | 9/2013 | Ma ....................... | H04B 1/1027 348/607 |
| 8,582,035 B2 * | 11/2013 | Shukla .................... | H04N 5/52 348/470 |

* cited by examiner

Primary Examiner — Khanh C Tran
(74) Attorney, Agent, or Firm — Edell, Shapiro & Finnan, LLC

(57) ABSTRACT

A signal receiving apparatus includes a signal processing circuit, an adjacent-channel interference (ACI) filter and an ACI detecting circuit. The signal processing circuit performs a signal processing process on an input signal to generate a processed signal. The ACI filter filters out ACI from the processed signal to generate a filtered signal. The ACI detecting circuit detects an energy difference between the processed signal and the filtered signal, and provides the energy difference to the signal processing circuit as a reference for adjusting the signal processing process.

8 Claims, 3 Drawing Sheets

SIGNAL RECEIVING APPARATUS IN COMMUNICATION SYSTEM AND SIGNAL PROCESSING METHOD THEREOF

This application claims the benefit of Taiwan application Serial No. 106143020, filed Dec. 7, 2017, the subject matter of which is incorporated herein by reference.

BACKGROUND OF THE INVENTION

Field of the Invention

The invention relates to a communication system, and more particularly to an adjacent-channel interference (ACI) detection technology in a communication system.

Description of the Related Art

With the advancement of electronics-related technologies, diversified communication devices are ever-increasingly popular. FIG. 1 shows a partial circuit of a communication receiver. An auto-gain control circuit 102 applies a gain G to an input signal $S_I$ by using an amplifier 102a to generate an amplified signal $S_A$. An analog-to-digital converter (ADC) 104 digitalizes the amplified signal $S_A$ to generate a digital sample result $S_D$. An adjacent-channel interference (ACI) filter 106 filters out ACI from the digital sample result $S_D$, and a filtered signal $S_F$ outputted from the ACI filter 106 is forwarded to a back-end digital signal processing circuit (e.g., a decoder) for further processing.

As shown in FIG. 1, the gain G that the amplifier 102a applies to the input signal $S_I$ is determined by means of feedback based on the digital sample result $S_D$. More specifically, a gain determining circuit 102b usually determines the gain G according to an average of absolute values of the amplitude (to be referred to as an average amplitude) of the digital sample result $S_D$, and aims at an operation target of causing the average amplitude to approach a reference amplitude R, wherein the reference amplitude R is set according to a characteristic of the input signal $S_I$ (e.g., a television system standard with which the input signal $S_I$ complies).

In a real communication environment, the input signal $S_I$ may be superimposed with ACI, and thus has a higher amplitude at certain time points. FIG. 2(A) shows an example of a relationship of absolute values of the amplitude of the input signal $S_I$ versus time. In this example, the average amplitude of the input signal $S_I$ falls around 0.4 V, and amplitude values differing significantly (to be referred to as abnormal amplitude values) from the average value appear at three positions 22, 22 and 23 indicated by dotted circles as a result of the above ACI. FIG. 2(B) shows an example of a relationship of absolute values of the amplitude of the amplified signal $S_A$ versus time. Assume that a predetermined reference amplitude R is 0.7 V, and an initial value of the gain G is 1. Because the average amplitude of the digital sample result $S_D$ is 0.4 V, modifying the gain G originally in a value of 1 causes the average amplitude of the amplified signal $S_A$ to fall around 0.7 V. In this example, a dynamic range of the input signal of the ADC 104 is ±1.2 V. Although most part of the amplified signal having an average amplitude of 0.7 V falls within this dynamic range, the abnormal amplitude values at three positions 21', 22' and 23' (respectively corresponding to the positions 22, 22 and 23 in FIG. 2(A)) are amplified by the amplifier 102a to be greater than ±1.2 V. In practice, signal contents exceeding ±1.2 V in the amplified signal $S_A$ are cut off and discarded by the ADC 104 due to the limitation on the dynamic range for the input signal of the ADC 104, resulting in a distortion issue.

As the presence of the abnormal amplitude values cannot be reflected, determining the gain G solely according to the average amplitude of the digital sample result $S_D$ likely causes the above distortion issue. Such distortion caused by amplitude saturation yields a huge drawback—even if the subsequent ACI filter 106 or another filter circuit is capable of eliminating the influences of ACI and surge interference, the original signal contents cannot be reconstructed.

SUMMARY OF THE INVENTION

The invention is directed to a signal receiving apparatus and a signal processing method thereof for resolving the above issue.

According to an embodiment of the present invention, a signal receiving apparatus is provided. The signal receiving apparatus includes a signal processing circuit, an adjacent-channel interference (ACI) filter and an ACI detecting circuit. The signal processing circuit performs a signal processing process on an input signal to generate a processed signal. The ACI filter filters out ACI from the processed signal to generate a filtered signal. The ACI detecting circuit detects an energy difference between the processed signal and the filtered signal, and provides the energy difference to the signal processing circuit to serve as a reference for adjusting the signal processing process.

According to another embodiment of the present invention, a signal processing method for a signal receiving apparatus is provided. The method includes: performing a signal processing process on an input signal to generate a processed signal; filtering out ACI from the processed signal to generate a filtered signal; and detecting an energy difference between the processed signal and the filtered signal, and using the energy difference as a reference for adjusting the signal processing process.

The above and other aspects of the invention will become better understood with regard to the following detailed description of the preferred but non-limiting embodiments. The following description is made with reference to the accompanying drawings.

Figure 1:
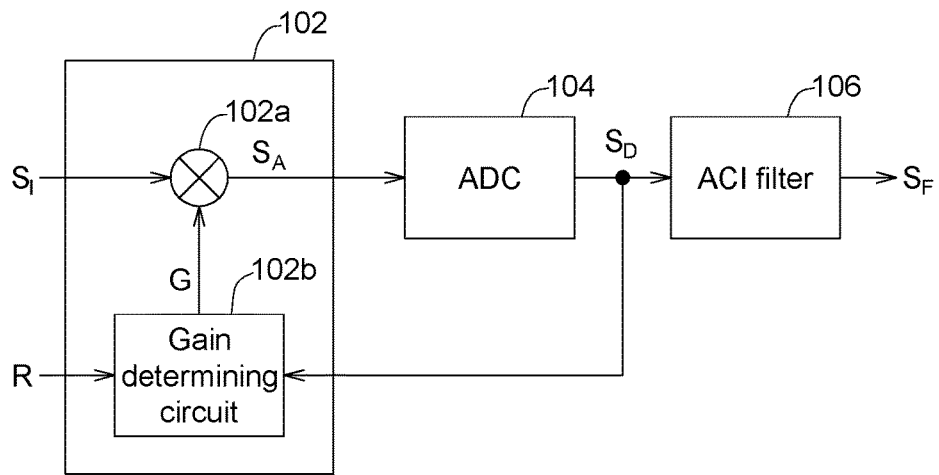
FIG. 1 (prior art) is a partial circuit of a communication receiver.
Figure 2A:
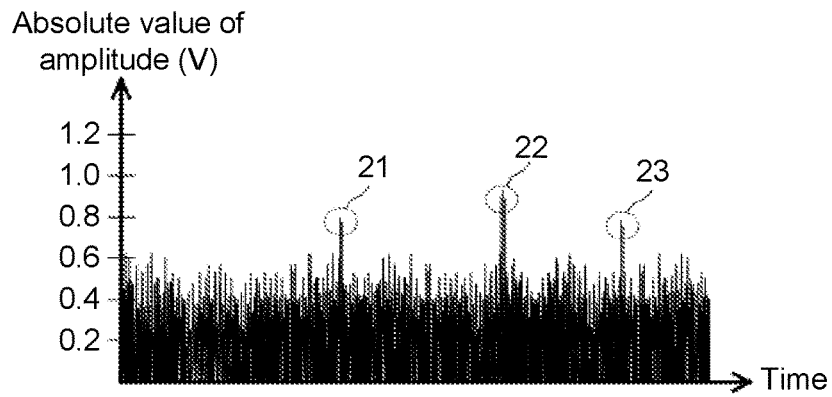
FIG. 2(A) (prior art) is an example of a relationship of absolute values of an amplitude of an input signal versus time.
Figure 2B:
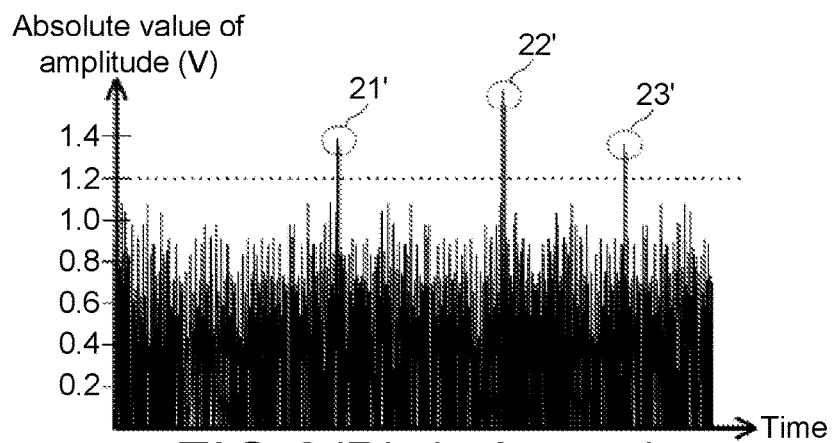
FIG. 2(B) (prior art) is an example of a relationship of absolute values of an amplitude of an amplified signal versus time.

It should be noted that, the drawings of the present invention include functional block diagrams of multiple functional modules related to one another. These drawings are not detailed circuit diagrams, and connection lines therein are for indicating signal flows only. The interactions between the functional elements/or processes are not necessarily achieved through direct electrical connections. Further, functions of the individual elements are not necessarily distributed as depicted in the drawings, and separate blocks are not necessarily implemented by separate electronic elements.

DETAILED DESCRIPTION OF THE INVENTION

Figure 3:
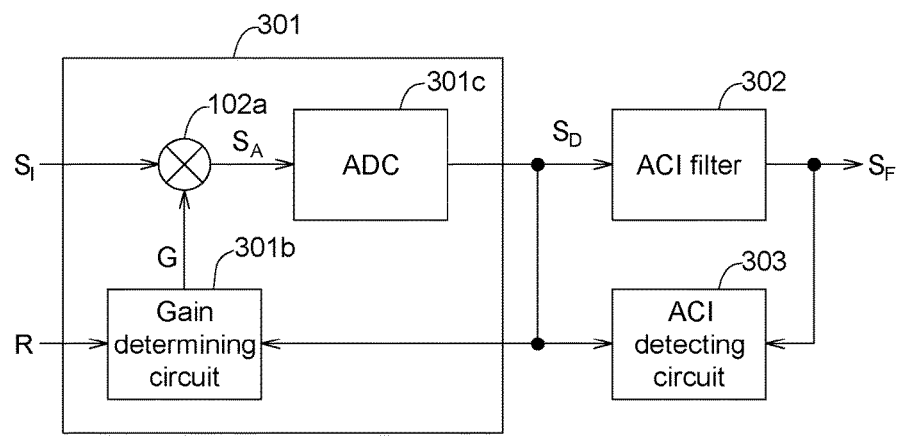
FIG. 3 is a function block diagram of a signal receiving apparatus according to an embodiment of the present invention.

FIG. 3 shows a function block diagram of a signal receiving apparatus operating in a communication system according to an embodiment of the present invention. A signal receiving apparatus 300 includes a signal processing circuit 301, an adjacent-channel interference (ACI) filter 302 and an ACI detecting circuit 303. In practice, the signal receiving apparatus 300 may be various types of communication receivers with an ACI filter function, e.g., an Advanced Television Systems Committee (ATSC) or a Digital Terrestrial Multimedia Broadcast (DTMB) receiver. Operation details of the circuits in the signal receiving apparatus 300 are given below.

Figure 4A:
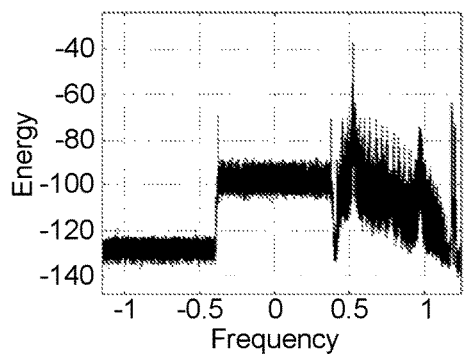
FIG. 4(A) and FIG. 4(B) are examples of spectra of input signals and output signals of an ACI filter.
Figure 4B:
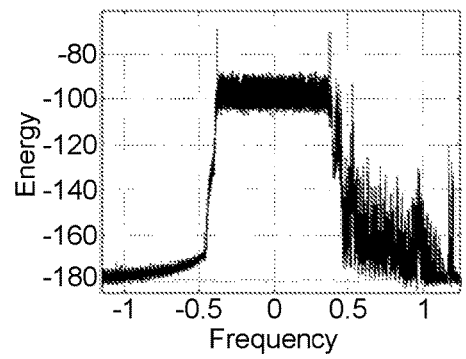

The signal processing circuit 301 includes an amplifier 301a, a gain determining circuit 301b and an analog-to-digital converter (ADC) 301c. The amplifier 301 applies a gain G (provided by the gain determining circuit 301b) to an input signal $S_I$ to generate an amplified signal $S_A$. The ADC 301c digitalizes the amplified signal $S_A$ to generate a digital sample result $S_D$. The ACI filter 302 filters out ACI from the digital sample result $S_D$ and preserves a signal within a target frequency band. A filtered signal $S_F$ outputted from the ACI filter 302 may be forwarded to a subsequent digital signal processing circuit (e.g., a decoder) for further processing. FIG. 4(A) shows an example of a spectrum of the digital sample signal $S_D$, and FIG. 4(B) shows an example of a spectrum of the corresponding filtered signal $S_F$, wherein the horizontal axis represents a standardized frequency and the vertical axis represents energy. It is seen by comparing FIG. 4(A) and FIG. 4(B) that, after passing through the ACI filter 302, the signal energy within the target frequency band (a frequency range of −0.4 to 0.4) is kept substantially unchanged, whereas the signal energy outside the target frequency band is significantly reduced. As previously described, the input signal $S_I$ may be superimposed with ACI, such that abnormal amplitude values may appear at certain time points. In general, the probability of getting an abnormal amplitude value of the input signal SI on the time axis gets larger as the ACI intensifies. The signal receiving apparatus 300 uses such characteristic to determine whether there is an abnormal amplitude signal in the time domain, and accordingly adaptively adjusts the gain G. Associated details are as follows.

The ACI detecting circuit 303 detects an energy difference $D_P$ between the digital sample result $S_D$ and the filtered signal $S_F$, and provides the energy difference $D_P$ to the gain determining circuit 102b. In practice, the ACI detecting circuit 303 may detect respective powers (to be represented by $P_D$ and $P_F$, respectively) of the digital sample result $S_D$ and the filtered signal $S_F$ by using a power detecting circuit. For example, on the spectrum, respective accumulated powers or power spectral densities (PSD) of the digital sample result $S_D$ and the filtered signal $S_F$ are obtained. In another example, respective average powers or accumulated powers of the digital sample result $S_D$ and the filtered signal $S_F$ within a predetermined period on the time axis are obtained.

The energy difference $D_P$ may be a difference between the powers $P_D$ and $P_F$, or may be a ratio obtained by dividing the power $P_D$ by the power $P_F$.

Whether ACI exists in the digital sample signal $S_D$ can be learned from the energy difference $D_P$. More specifically, if the digital sample signal $S_D$ hardly contains any ACI, the difference between the powers $P_D$ and $P_F$ of signals inputted into and outputted from the ACI 302 is quite small. In contrast, if ACI exists in the digital sample signal $S_D$, a noticeable difference exists between the powers $P_D$ and $P_F$; further, the energy difference $D_P$ gets larger as the ACI intensifies.

As shown in FIG. 3, when the gain G is determined, in addition to the average amplitude of the digital sample result $S_D$, the gain determining circuit 301b further takes into account the energy difference $D_P$. For example, the gain determining circuit 301b may compare whether the energy difference $D_P$ is higher than a predetermined threshold. In practice, the predetermined threshold is not limited to any specific value, while it is usually determined based on characteristics of signals of different communication systems and characteristics of ACI signals. In one embodiment, the predetermined threshold may be determined according to the tolerance of a signal processing circuit (e.g., a decoder) in the system with respect to the number of distorted signals in a received signal. As previously stated, the energy difference $D_P$ gets larger as the ACI intensifies, and the probability of an abnormal amplitude value appearing in the input signal $S_I$ also increases. For many decoders, decoding process may fail when the probability of distorted signals is higher than a predetermined value. In contrast, when the probability of distorted signals is lower than the predetermined value, the decoder is nonetheless capable of correcting the errors and correctly perform decoding even in the presence of distorted signals. Experiments or simulations may be conducted in advance to calculate a value of the energy difference $D_P$ that causes an excess number of distorted signals and degrades the performance of the decoder, and the predetermined threshold can be accordingly determined. If the energy difference $D_P$ is lower than the predetermined threshold, the gain determining circuit 301b is not required to decrease the gain G, i.e., the gain G determined according to the average amplitude of the digital sample result $S_D$ may be directly used. In contrast, if the energy difference $D_P$ is higher than the predetermined threshold, the gain determining circuit 301b may appropriately decrease the gain G, so as to prevent an abnormal amplitude, after having passing through the amplifier 301a, from exceeding the input signal dynamic range of the ADC 301c and hence from resulting in a decoding failure in the subsequent decoder. In another embodiment, the predetermined threshold may be set to zero. Thus, once the ACI detecting circuit 303 detects a non-zero energy difference $D_P$, the gain determining circuit 301b may adjust the gain G according to this energy difference $D_P$. In this embodiment, when the energy difference $D_P$ is equal to zero, the gain determining circuit 301b does not adjust the gain G.

In one embodiment, the gain determining circuit 301b determines a scale for decreasing the gain G according to the value of the energy difference $D_P$. More specifically, as the energy difference $D_P$ gets larger, the scale by which the gain determining circuit 301b decreases the gain G also gets larger. Ideally, under the premise of without distorting the input signal $S_A$ of the ADC 301c, the adjusted gain G gets better as it gets larger (which helps the ADC 301c analyze the amplified signal $S_A$). Thus, in one embodiment, the resolution of the ADC 301c is taken into consideration when the gain determining circuit 301*b* configures a lower limit of the gain G. When the value of the energy difference $D_P$ would cause the gain G to be lower than the lower threshold, the gain G is only adjusted to the lower limit instead of being adjusted further downward along with the increasing energy difference $D_P$. Setting the lower limit is to prevent an insufficiently small amplitude of the amplified signal $S_A$ from being unsuccessfully analyzed by the ADC 301*c*.

Figure 5A:
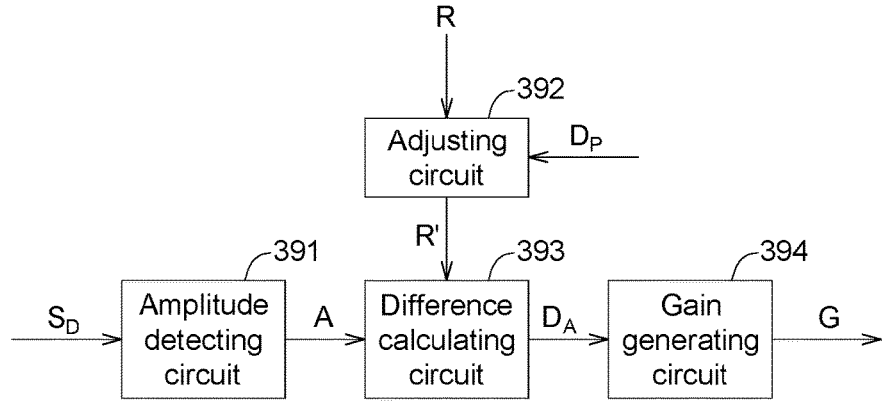
FIG. 5(A) and FIG. 5(B) are examples of a detailed circuit of a gain determining circuit according to embodiments of the present invention.
Figure 5B:
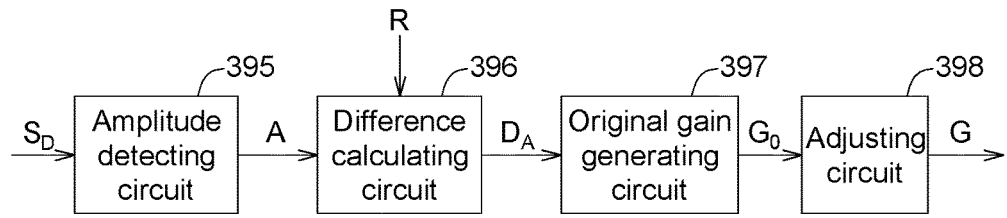

FIG. 5(A) and FIG. 5(B) show two examples of a detailed circuit of the gain determining circuit 301*b*. How the gain determining circuit 301*b* in the two examples adjusts the gain G are given in respective paragraphs below.

The gain determining circuit 301*b* in FIG. 5(A) includes an amplitude detecting circuit 391, an adjusting circuit 392, a difference calculating circuit 393 and a gain generating circuit 394. The amplitude detecting circuit 391 obtains an average amplitude A of the digital sample result $S_D$. The adjusting circuit 392 generates an adjusted reference amplitude R' according to the energy difference $D_P$ and the reference amplitude R. An adjustment ratio of the reference amplitude R have positive correlation with the value of the energy difference $D_P$; that, the extent of the adjustment of the reference amplitude R increases as the energy difference $D_P$ gets larger. An initial value of the reference amplitude R is set according to a characteristic of the input signal $S_I$ (e.g., a television system standard with which the input signal $S_I$ complies). The difference calculating circuit 393 calculates an amplitude difference $D_A$ between the average amplitude A and the adjusted reference amplitude R'. Through a look-up table or calculation, the gain generating circuit 394 generates the gain G according to the amplitude difference $D_A$; the amplitude difference $D_A$ has positive correlation with the gain G. For example, if the energy difference $D_P$ indicates that the ACI power in the digital sample result $S_D$ is higher than a predetermined threshold, the adjusting circuit 392 adjusts the reference amplitude R' to be lower than the reference amplitude R, so as to reduce the amplitude difference $D_A$ and to further allow the gain generating circuit 394 to generate a smaller gain G (compared to the gain generated according to the reference amplitude R). If the energy difference $D_P$ indicates that the ACI power in the digital sample signal $S_D$ is lower than the predetermined threshold, the adjusting circuit 392 can set the reference amplitude R' to be equal to the reference amplitude R (i.e., without adjusting the reference amplitude R'). In brief, by considering the energy difference $D_P$, the signal receiving apparatus 300 is capable of alleviating the issue of signal distortion caused by excessive amplification of abnormal amplitude values.

In practice, the gain determining circuit 301 continues dynamically adjusting the gain G. For example, if after using the gain G for a period, the energy difference $D_P$ shows that the ACI power in the digital sample signal $S_D$ is no longer higher than the predetermined threshold, the adjusting circuit 392 may then set the adjusted reference amplitude R' to be equal to the reference amplitude R.

The gain determining circuit 301*b* in FIG. 5(B) includes an amplitude detecting circuit 395, a difference calculating circuit 396, an original gain generating circuit 397 and an adjusting circuit 398. The amplitude detecting circuit 395 detects an average amplitude A of the digital sample result $S_D$. The difference calculating circuit 396 calculates an amplitude difference $D_A$ between the average amplitude A and the reference amplitude R. Through a look-up table or calculation, the original gain generating circuit 397 generates an original gain $G_0$. The adjusting circuit 398 adjusts the original gain Go according to the energy difference $D_P$ to accordingly generate the gain G. For example, if the energy difference $D_P$ shows that the ACI intensity in the digital sample signal $S_D$ is higher than a predetermined threshold, the adjusting circuit 398 sets the gain G to be lower than the original gain $G_0$, e.g., setting the value of the gain G to be equal to 90% of the original gain $G_0$.

One person skilled in the art can understand that, there are various circuit configurations and components capable of achieving the concept of the gain determining circuit 301*b* without departing from the spirit of the present invention. In practice, the gain determining circuit 301*b* may be implemented by various control and processing platforms, e.g., fixed and programmable logic circuits such as programmable gate arrays, application-specific integrated circuits, microcontrollers, microprocessors and digital signal processors. Further, the gain determining circuit 301*b* may also be designed to complete associated tasks through executing a processor instruction stored in a memory (not shown).

It should be noted that, the energy difference $D_P$ may be used as reference information for adjusting other signal processing processes, other than the above gain G. More specifically, the energy difference $D_P$ can indicate whether ACI exists in the digital sample result $S_D$ and the approximate intensity of the ACI, and any circuit located before the ACI filter 302 and needing related information may refer to the energy difference $D_P$.

Figure 6:
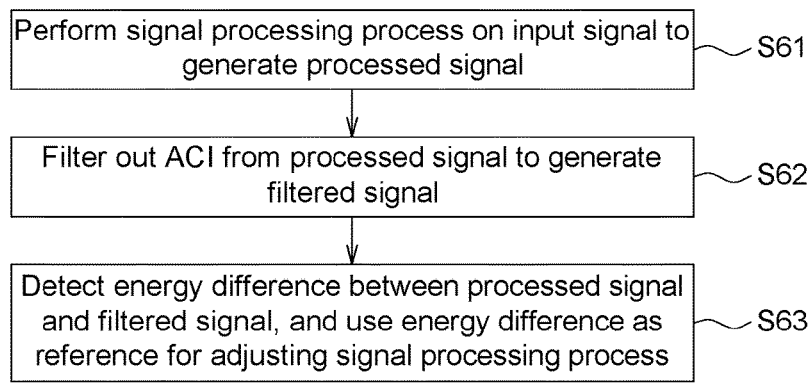
FIG. 6 is a flowchart of a signal processing method according to an embodiment of the present invention.

FIG. 6 shows a flowchart of a signal processing method for a signal receiving apparatus according to another embodiment of the present invention. In step S61, a signal processing process is performed on an input signal to generate a processed signal. In step S62, ACI is filtered out from the processed signal to generate a filtered signal. In step S63, an energy difference between the processed signal and the filtered signal is detected, and the energy difference is used as a reference for adjusting the signal processing process. One person skilled in the art can understand that, the operation variations in the foregoing description associated with the signal receiving apparatus 300 are applicable to the signal process method in FIG. 6, and shall be omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal receiving apparatus, comprising:
   a signal processing circuit, performing a signal processing process on an input signal to generate a processed signal;
   an adjacent-channel interference (ACI) filter, filtering out ACI from the processed signal to generate a filtered signal; and
   an ACI detecting circuit, detecting an energy difference between the processed signal and the filtered signal, and providing the energy difference to the signal processing circuit to serve as a reference for adjusting the signal processing process,
   wherein the signal processing circuit comprises:
   an amplifier, applying a gain to the input signal to generate an amplified signal;
   a gain determining circuit, receiving the energy difference, and adjusting the gain used by the amplifier according to the energy difference; and an analog-to-digital converter (ADC), digitalizing the amplified signal to generate the processed signal, and wherein the gain determining circuit determines whether the energy difference is higher than a predetermined threshold, and adjusts the gain according to the energy difference when the energy difference is higher than the predetermined threshold.

2. The signal receiving apparatus according to claim 1, wherein the predetermined threshold is set according to a signal characteristic of the ACI.

3. The signal receiving apparatus according to claim 1, wherein when the gain determining circuit adjusts the gain, the gain determining circuit further determines whether the gain adjusted according to the energy difference is lower than a lower limit, the gain determining circuit sets the gain as the lower limit if the gain adjusted according to the energy difference would be lower than the lower limit, and the lower limit is set according to a signal resolution of the ADC.

4. The signal receiving apparatus according to claim 1, wherein the energy difference between the processed signal and the filtered signal indicates an intensity of the ACI.

5. A signal processing method for a signal receiving apparatus, comprising:
   a) performing a signal processing process on an input signal to generate a processed signal;
   b) filtering out adjacent-channel interference (ACI) from the processed signal to generate a filtered signal; and
   c) detecting an energy difference between the processed signal and the filtered signal, and utilizing the energy difference as a reference for adjusting the signal processing process, wherein step (a) comprises:

applying a gain to the input signal to generate an amplified signal; and digitalizing the amplified signal by an analog-to-digital converter (ADC) to generate the processed signal; and wherein the energy difference generated in step (a) is used for adjusting the gain, and determining whether the energy difference is higher than a predetermined threshold, and adjusting the gain according to the energy difference when the energy difference is higher than the predetermined threshold.

6. The signal processing method according to claim 5, wherein the predetermined threshold is set according to a signal characteristic of the ACI.

7. The signal processing method according to claim 5, further comprising:

determining whether the gain adjusted according to the energy difference is lower than a lower limit, and setting the gain as the lower limit if the gain adjusted according to the energy difference would be lower than the lower limit;

wherein, the lower limit is set according to a signal resolution of the ADC.

8. The signal processing method according to claim 5, wherein the energy difference between the processed signal and the filtered signal indicates an intensity of the ACI.

* * * * *